US008620847B2

(12) United States Patent
Suzuki

(10) Patent No.: US 8,620,847 B2
(45) Date of Patent: Dec. 31, 2013

(54) TRAFFIC SITUATION PREDICTION APPARATUS

(75) Inventor: Takamitsu Suzuki, Okazaki (JP)

(73) Assignee: DENSO CORPORATION, Kariya (JP)

( * ) Notice: Subject to any disclaimer, the term of this patent is extended or adjusted under 35 U.S.C. 154(b) by 187 days.

(21) Appl. No.: 13/211,424

(22) Filed: Aug. 17, 2011

(65) Prior Publication Data

US 2012/0054145 A1  Mar. 1, 2012

(30) Foreign Application Priority Data

Aug. 31, 2010  (JP) ................................. 2010-194918

(51) Int. Cl.
*G06N 99/00* (2010.01)
*G08G 1/01* (2006.01)
*G06F 17/50* (2006.01)

(52) U.S. Cl.
CPC ............ *G06N 99/005* (2013.01); *G08G 1/0104* (2013.01); *G06F 17/5018* (2013.01)
USPC ...................... 706/45; 701/117; 703/2; 703/6

(58) Field of Classification Search
None
See application file for complete search history.

(56) References Cited

U.S. PATENT DOCUMENTS

| 2006/0058940 | A1 | 3/2006 | Kumagai et al. | |
| 2006/0111833 | A1* | 5/2006 | Feldman et al. | ............... 701/117 |
| 2009/0138188 | A1* | 5/2009 | Kores et al. | .................... 701/117 |

FOREIGN PATENT DOCUMENTS

| JP | A-2003-122908 | 4/2003 |
| JP | A-2003-288459 | 10/2003 |
| JP | A-2005-352649 | 12/2005 |
| JP | A-2008-152577 | 7/2008 |
| JP | A-2008-298457 | 12/2008 |
| JP | A-2010-14556 | 1/2010 |
| WO | WO 2010/007667 A1 | 1/2010 |

OTHER PUBLICATIONS

Office Action mailed on Aug. 28, 2012 issued in corresponding JP application No. 2010-194918 (and English translation).
Office Action dated Sep. 6, 2013 in the corresponding CN application No. 201110259882.X (English translation).

* cited by examiner

*Primary Examiner* — Alan Chen
(74) *Attorney, Agent, or Firm* — Posz Law Group, PLC

(57) ABSTRACT

A traffic situation prediction apparatus for predicting a traffic situation based on a traffic situation statistical data is disclosed. The traffic situation prediction apparatus includes a map information storage and a controller. The apparatus determines, in response to an update of the map information, whether a specific factor affecting a traffic flow has emerged based on a difference between the map information before and after the update. The apparatus identifies an effect on the traffic flow resulting from emergence of the specific when the specific traffic flow effect factor has emerged. The apparatus predicts the traffic situation by incorporating the identified effect into the traffic situation predicted based on the traffic situation statistical data.

11 Claims, 10 Drawing Sheets

FIG. 3

《 YEAR CLASSIFICATION 》

| ID | LARGE CATEGORY | MEDIUM CATEGORY | SMALL CATEGORY |
|---|---|---|---|
| VC1 | LONG HOLYDAY SEASON | WINTER HOLYDAYS (AROUND NEW YEAR'S DAY) | |
| VC2 | | SPRING HOLYDAYS (AROUND GOLDEN WEEK) | |
| VC3 | | SUMMERY HOLYDAYS (SUMMER VACATION) | |
| WN1 | OTHER | WINTER | SUNDAY, PUBLIC HOLYDAY |
| WN2 | | | MONDAY |
| WN3 | | | TUESDAY |
| WN4 | | | WEDNESDAY |
| WN5 | | | THURSDAY |
| WN6 | | | FRIDAY |
| WN7 | | | SATURDAY |
| SP1 | | SPRING | SUNDAY, PUBLIC HOLYDAY |
| SP2 | | | MONDAY |
| SP3 | | | TUESDAY |
| SP4 | | | WEDNESDAY |
| SP5 | | | THURSDAY |
| SP6 | | | FRIDAY |
| SP7 | | | SATURDAY |
| SM1 | | SUMMER | SUNDAY, PUBLIC HOLYDAY |
| SM2 | | | MONDAY |
| SM3 | | | TUESDAY |
| SM4 | | | WEDNESDAY |
| SM5 | | | THURSDAY |
| SM6 | | | FRIDAY |
| SM7 | | | SATURDAY |
| AU1 | | AUTUMN | SUNDAY, PUBLIC HOLYDAY |
| AU2 | | | MONDAY |
| AU3 | | | TUESDAY |
| AU4 | | | WEDNESDAY |
| AU5 | | | THURSDAY |
| AU6 | | | FRIDAY |
| AU7 | | | SATURDAY |

FIG. 4

《 TRAFFIC SITUATION STATISTICAL DATA 》

| ROAD NUMBER | ACQUIRED DATE-AND-TIME | YEAR CLASSIFICATION | HOUR | TRAFFIC SITUATION | | | |
|---|---|---|---|---|---|---|---|
| | | | | TRAFFIC JAM DEGREE | TRANSMIT TIME | TRAFFIC AMOUNT | ... |
| RDXXX | YYMMDDHHMM | VC1 | 00:00 ~ 03:00 | level0 | 0MIN. AND 0SEC. | ... | ... |
| | | | 03:00 ~ 05:00 | level0 | 0MIN. AND 0SEC. | ... | ... |
| | | | 05:00 ~ 06:00 | level0 | 0MIN. AND 0SEC. | ... | ... |
| | | | 06:00 ~ 06:30 | level0 | 0MIN. AND 0SEC. | ... | ... |
| | | | 06:30 ~ 07:00 | level0 | 0MIN. AND 0SEC. | ... | ... |
| | | | 07:00 ~ 07:15 | level0 | 0MIN. AND 0SEC. | ... | ... |
| | | | ... | ... | ... | ... | ... |
| ... | ... | ... | | | | | |

FIG. 6

《TRAFFIC SITUATION TENDENCY DB》

| ROAD NUMBER | YEAR CLASSIFICATION | HOUR | TRAFFIC SITUATION ||||
|---|---|---|---|---|---|---|
| | | | TRAFFIC JAM DEGREE | TRANSMIT TIME | TRAFFIC AMOUNT | ... |
| RDXXX | VC1 | 00:00 ~ 03:00 | level 0 | 0MIN. AND 0SEC. | ... | ... |
| | | 03:00 ~ 05:00 | level 0 | 0MIN. AND 0SEC. | ... | ... |
| | | 05:00 ~ 06:00 | level 0 | 0MIN. AND 0SEC. | ... | ... |
| | | 06:00 ~ 06:30 | level 0 | 0MIN. AND 0SEC. | ... | ... |
| | | 06:30 ~ 07:00 | level 0 | 0MIN. AND 0SEC. | ... | ... |
| | | 07:00 ~ 07:15 | level 0 | 0MIN. AND 0SEC. | ... | ... |
| | | ... | ... | ... | ... | ... |
| ... | ... | | | | | |

FIG. 7

《 FACTOR-BY-FACTOR TRAFFIC FLOW EFFECT DB 》

| MAP CHANGE FACTOR | TARGET ROAD | TRAFFIC SITUATION CHANGE AMOUNT | | | |
|---|---|---|---|---|---|
| | | HOUR | TRAFFIC JAM DEGREE | TRANSIT TIME | |
| AMUSEMENT PARK ON THE SCALE OF 500 VEHICLES PARKING LOT | LOCATED WITHIN 1km | 00:00 ~ 03:00 | ±level △ | ±0MIN. AND 0SEC. | ... |
| | | 03:00 ~ 05:00 | ±level △ | ±0MIN. AND 0SEC. | ... |
| | | 05:00 ~ 06:00 | ±level △ | ±0MIN. AND 0SEC. | ... |
| | | 06:00 ~ 06:30 | ±level △ | ±0MIN. AND 0SEC. | ... |
| | | 06:30 ~ 07:00 | ±level △ | ±0MIN. AND 0SEC. | ... |
| | | 07:00 ~ 07:15 | ±level △ | ±0MIN. AND 0SEC. | ... |
| | | ... | ... | ... | ... |
| | LOCATED WITHIN 3km | | | | |
| | ... | | | | |
| NEW-CONSTRUCTION OF 5km BYPASS HIGHWAY | BYPASSED ROAD | | | | |
| | 5km ROAD BEFORE INTERSECT. TO BYPASS | | | | |
| | 5km ROAD AFTER BYPASS HIGHWAY | | | | |
| | BYPASS HIGHWAY | | | | |
| | ... | | | | |
| ... | | | | | |

TRAFFIC SITUATION PREDICTION APPARATUS

CROSS REFERENCE TO RELATED APPLICATION

The present application is based on and claims priority to Japanese Patent Application No. 2010-194918 filed on Aug. 31, 2010, disclosure of which is incorporated herein by reference.

TECHNICAL FIELD

The present disclosure relates to a traffic situation prediction apparatus for predicting a traffic situation based on a traffic situation statistical data created by collecting information on runs of vehicles on roads.

BACKGROUND

As one kind of traffic situation prediction apparatus, a traffic jam prediction apparatus is known (cf. Patent Document 1 for example). The traffic jam prediction apparatus accepts an input of factor information, which relates to information about a factor for traffic jam generation such as a narrow width road and the like. The apparatus predicts generation of a traffic jam caused by the factor indicated by the factor information. By using a result of this prediction and a traffic jam database accumulating past traffic jam information (information about traffic jam in past), the apparatus predicts a traffic jam.

Patent Document 1: JP-2010-14556A

According to an apparatus described in Patent Document 1, a user inputs the factor information. Therefore, the user needs to consistently collect and input the information about a factor for traffic jam generation such as new-construction or destruction of a large facility, new-construction of a bypass highway, expansion of a road to increase traffic lanes, and the like. When the factor information is not appropriately inputted based on the information about the above factors for traffic jam generation, traffic jam prediction accuracy is lowered.

SUMMARY

In view of the forgoing, it is an objective of the present disclosure to provide a traffic situation prediction apparatus that can improve traffic situation prediction accuracy.

According to a first aspect of the present disclosure, a traffic situation prediction apparatus for predicting a traffic situation based on traffic situation statistical data created by collecting information on runs of vehicles on roads includes a map information storage, a determination section, an effect identification section, and a traffic information prediction section. The map information storage stores map information. The determination section is configured to determine, in response to an update of the map information stored in the map information storage, whether a specific traffic flow effect factor affecting a traffic flow has emerged based on a difference between the map information before and after the update. The effect identification section is configured to identify an effect on the traffic flow resulting from emergence of the specific traffic flow effect factor when the determination section determines that the specific traffic flow effect factor has emerged. The traffic information prediction section is configured to predict the traffic situation by incorporating (i) the effect identified by the effect identification section into (ii) the traffic situation predicted based on the traffic situation statistical data.

According to a second aspect of the present disclosure, a traffic situation prediction apparatus for predicting a traffic situation based on traffic situation statistical data created by collecting information on runs of vehicles on roads includes a map information storage, a determination section, an effect prediction database storage, an effect identification section, a traffic information prediction section and a statistical data deletion section. The map information storage stores map information. The determination section is configured to determine, in response to an update of the map information stored in the map information storage, whether a specific traffic flow effect factor affecting a traffic flow has emerged based on a difference between the map information before and after the update of the map information. The effect prediction database storage stores a factor-by-factor traffic flow effect database that predicts an effect of each of various traffic flow effect factors on the traffic flow on a factor-by-factor basis. The effect identification section is configured to identify the effect on the traffic flow resulting from emergence of the specific traffic flow effect factor by referring to the factor-by-factor traffic flow effect database when the determination section determines that the specific traffic flow effect factor has emerged. The traffic information prediction section is configured to predict the traffic situation in a specific area by incorporating (i) the effect identified by the effect identification section into (ii) the traffic situation predicted based on the traffic situation statistical data when the determination section determines that the specific traffic flow effect factor has emerged, wherein the specific area is an area where the specific traffic flow effect factor has emerged. The statistical data deletion section is configured to delete a specific portion of the traffic situation statistical data when the determination section determines that the specific traffic flow effect factor has emerged, wherein the specific portion represents the traffic situation in the specific area before the emergence of the specific traffic flow effect factor. The traffic situation statistical data is successively updated after the determination section determines that the specific traffic flow effect factor has emerge and after the traffic information prediction section has predicted the traffic situation in the specific area by incorporating the identified effect into the traffic situation predicted based on the traffic situation statistical data. The traffic information prediction section is further configured to predict the traffic situation in the specific area based on the traffic situation statistical data having successively-updated after the emergence of the specific traffic flow effect factor.

According to the above traffic situation prediction apparatus, it is possible to improve traffic situation prediction accuracy.

BRIEF DESCRIPTION OF THE DRAWINGS

The above and other objects, features and advantages of the present disclosure will become more apparent from the following detailed description made with reference to the accompanying drawings. In the drawings:

FIG. 3 is a diagram illustrating vehicle run information classified by large category, medium category and small category to create a statistical data;

FIG. 4 is a diagram for explanation on creation of a statistical data;

FIG. 6 is a diagram illustrating a traffic situation tendency database;

FIG. 7 is a diagram illustrating a factor-by-factor traffic flow effect database;

DETAILED DESCRIPTION

Figure 1:
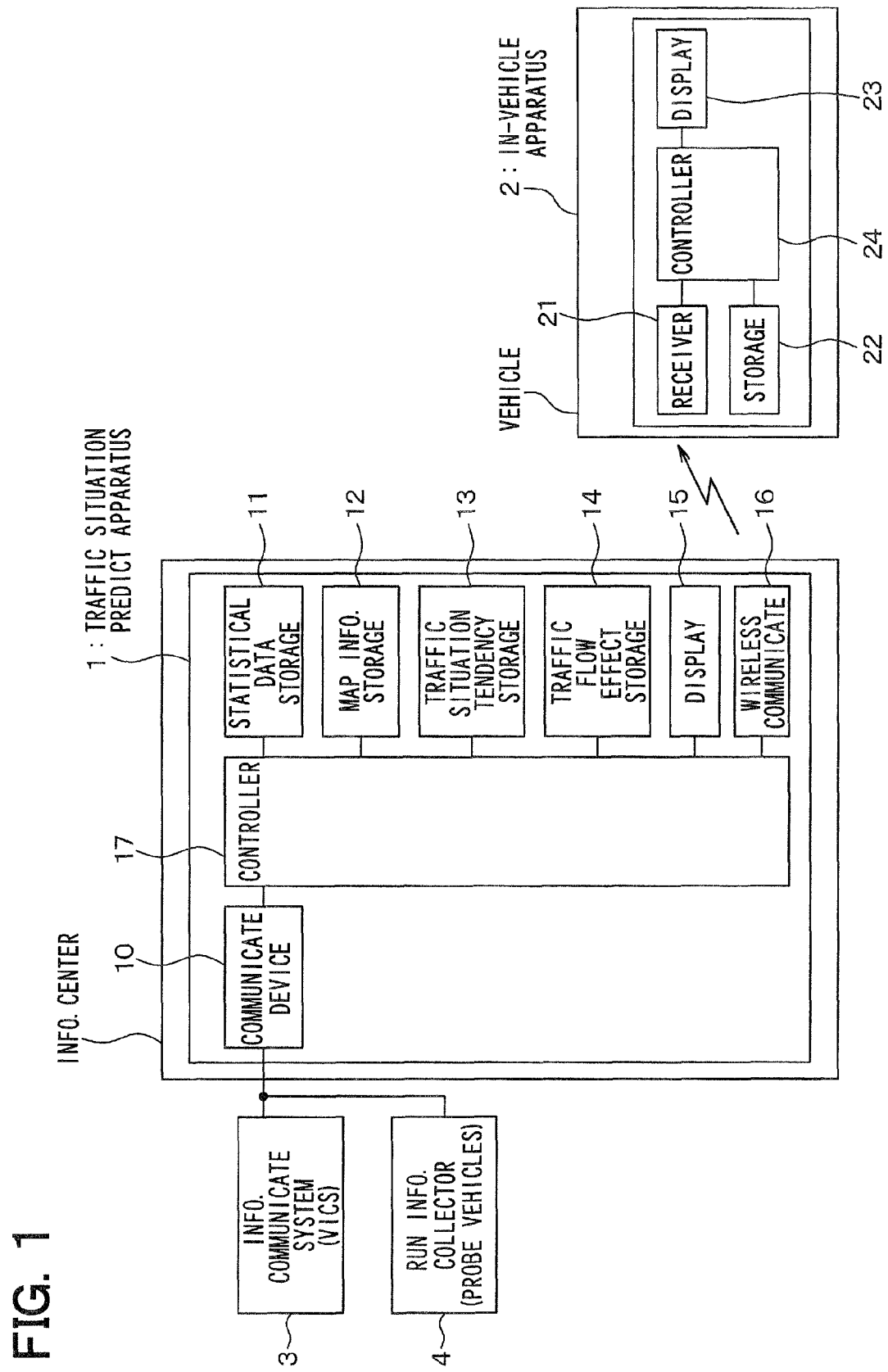
FIG. 1 is a diagram illustrating a traffic situation prediction apparatus of one embodiment.

A configuration of a traffic situation prediction apparatus 1 of one embodiment is illustrated in FIG. 1. The traffic situation prediction apparatus 1 is configured as a server installed in an information center for providing traffic information. The traffic situation prediction apparatus 1 predicts a traffic situation based on a traffic situation statistical data created by collecting vehicle run information, which is information on runs of vehicles on roads. The traffic situation prediction apparatus 1 wirelessly transmits traffic information including the predicted traffic situation. An in-vehicle apparatus 2 is mounted to a vehicle. The in-vehicle apparatus 2 receives traffic information wirelessly transmitted from the traffic situation prediction apparatus 1, and displays traffic situations in various areas based on the received traffic information.

The traffic situation prediction apparatus 1 includes a communication device 10, a statistical data storage 11, a map information storage 12, a traffic situation tendency database storage 13, a factor-by-factor traffic flow effect database storage 14, a display device 15, a wireless transmitter 16, and a controller 17.

The communication device 10 communicates with apparatuses for collecting the vehicle run information, which is information on runs of vehicles on roads. The apparatuses for collecting the vehicle run information include an information communication system 3, a run information collection apparatus 4 and the like. The information communication system 3 distributes the traffic information and collects the vehicle run information by using, for example, a VICS (Vehicle Information and Communication System) antenna installed on a roadside. The run information collection apparatus 4 collects the vehicle run information collected by probe vehicles such as taxies and the like.

The statistical data storage 11 stores a traffic situation statistical data (also simply referred to as statistical data) created by the collection of the vehicle run information, which is information on runs of vehicles on roads.

The map information storage 12 stores latest (newest-version) map information, old-version map information, map information difference and the like. The map information difference includes an extracted difference between the map information of different versions.

The map information includes road information, background information, and facility information. The road information indicates link ID (identification information), start coordinate point, end coordinate point, length, road type, road width, road shape, road name and number of lanes etc. of each link. The background information indicates location, shape and name of river, lake, ocean, railway, facility and the like. The facility information indicates name, location, type, phone number and the like of facilities in various areas.

In the present embodiment, the facility information includes information for identifying scale of a facility, such as a date (year-month-day) of open for business, a vehicle parking capacity, a person accommodation capacity, a number of employees, a site area or the like. The road information for a new-constructed road includes information for identifying a date (year-month-day) of open.

The traffic situation tendency database storage 13 stores a traffic situation tendency database, which provides an analysis of a traffic situation tendency before and after emergence of a traffic flow effect factor. The traffic flow effect factor is a factor that affects a traffic flow, such as new-construction of a large facility, open of a bypass highway, and the like.

A factor-by-factor traffic flow effect database storage 14 stores a traffic flow effect database. On a per traffic-flow-effect-factor basis, the traffic flow effect database predicts an effect of mergence of each of various traffic flow effect on a traffic flow, based on how the traffic flow was affected by the emergence of the each of the various traffic flow effect factors in past.

In the present embodiment, the statistical data storage 11, the map information storage 12, the traffic situation tendency database storage 13 and the factor-by-factor traffic flow effect database storage 14 are constructed by a hard disk drive.

The display device 15 includes a display such as a liquid crystal display and the like, and displays an image in accordance with an image signal inputted from the controller 17.

The wireless transmitter 16 wirelessly transmits traffic information indicating a traffic situation to a vehicle equipped with the in-vehicle apparatus 2.

The controller 17 includes a computer with a CPU (central processing unit), a memory, an I/O (input/output) and the like. The CPU performs various processes in accordance with programs stored in the memory.

The in-vehicle apparatus 2 includes a receiver 21 for receiving the traffic information wirelessly transmitted from the traffic situation prediction apparatus 1, a storage 22 for storing various data, a display device 23 for displaying various images, and a controller 24. The controller 24 includes a computer with a CPU, an I/O (input/output) and the like. The CPU performs various processes in accordance with programs stored in the storage 22.

Next, the processes of the controller 17 of the traffic situation prediction apparatus 1 will be described. The processes of the controller 17 include a map information update process, a traffic flow effect prediction database record process, a traffic flow effect prediction process, and a traffic situation prediction process. The map information update process can be used to update the map information stored in the map information storage 12 in response to operator's manipulation. The statistical data creation process can be used to create a traffic situation statistical data through collecting the vehicle run information (information on runs of vehicles on roads) from the apparatus connected via the communication device 10. The traffic flow effect prediction database record process can be used to record a traffic flow effect database in response to the update of the map information. The traffic flow effect database predicts an effect on a traffic flow resulting from emergence of each of various traffic flow effect factors (which is a factor affecting a traffic flow). The traffic flow effect prediction process can be used to determine, in cases where the map information stored in the map information storage 12 is determined to be updated, whether a traffic flow effect factor affecting a traffic flow has emerged based on a difference between the map information before the update and the map information after the update. The traffic flow effect prediction process can be further used to predict an effect on the traffic flow resulting from emergence of the traffic flow effect factor when it is determined that the traffic flow effect factor affecting a traffic flow has emerged. The traffic situation prediction process can be used to predict a traffic situation by incorporating (reflecting) the effect predicted at the traffic flow effect prediction process into a traffic flow predicted based on the statistical data.

Figure 2:
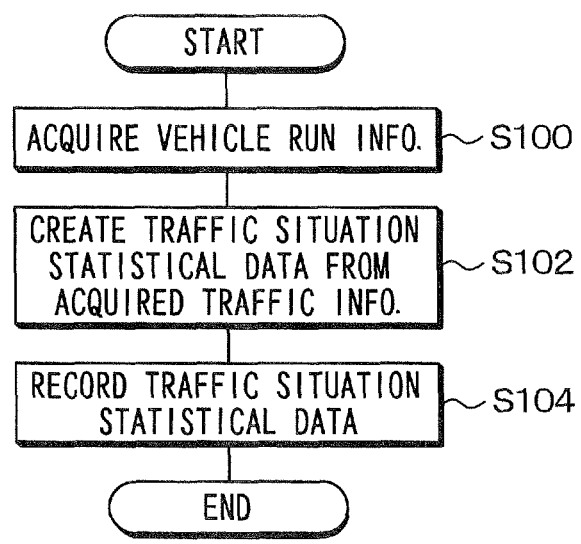
FIG. 2 is a flowchart illustrating a statistical data creation process.

First, the statistical data creation process will be described. FIG. 2 is a flowchart illustrating the statistical data creation process. The controller 17 of the traffic situation prediction apparatus 1 periodically performs the process illustrated in FIG. 2.

First, at S100, the controller 17 establishes a connection to the information communication system 3 or the run information collection apparatus 4 via the communication device 10, and acquires the vehicle run information, which is the information on the vehicles running on the roads.

At S102, the controller 17 classifies the vehicle run information acquired at S100 according to items in a large category, a medium category and a small category as illustrated in FIG. 3, and creates a traffic situation statistical data, which is statistics of traffic situation classified on a hourly basis as illustrated in FIG. 4.

At S104, the controller 17 records the traffic situation statistical data created at S102 in the statistical data storage 11, and ends the statistical data creation process.

The controller 17 periodically performs the above-described statistical data creation process, so that the traffic situation statistical data is accumulated and stored in the statistical data storage 11 and successively updated.

Figure 5:
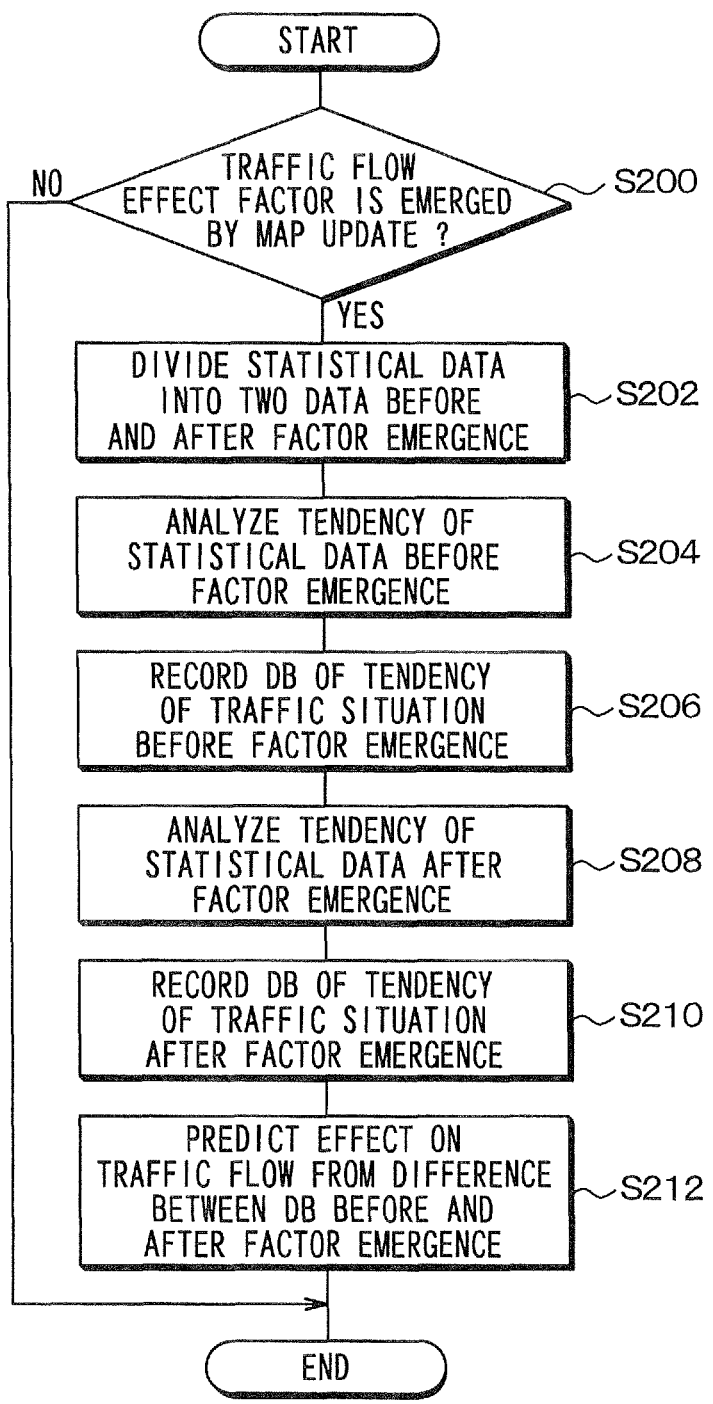
FIG. 5 is a flowchart illustrating a traffic flow effect prediction database record process.

Next, the traffic flow effect prediction database record process will be described. FIG. 5 is a flowchart illustrating the traffic flow effect prediction database record process. In response to the update of the map information stored in the map information storage 12 at the map information update process, the controller 17 of the traffic situation prediction apparatus 1 performs the traffic flow effect prediction database record process.

At S200, the controller 17 determines whether a traffic flow effect factor affecting a traffic flow, has emerged from the update of the map information. The traffic flow effect factor includes, for example, new-construction of a facility such as a giant commercial facility, a factory and the like, close of a facility, demolition of a facility, scale up of a facility, scale down of a facility, new-construction of a road, close of a road, a change in number of lanes of a road, and the like. Specifically, by referring to information on the map information difference stored in the map information storage 12, the controller 17 determines whether the update of the map information has brought a change in facility information, the road information, the background information or the like that affects a traffic flow. The controller 17 can determine whether the change affects the traffic flow, based on for example facility scale information, which indicates facility scale and is contained in the facility information.

For example, if a giant commercial facility, which is large so as to affect a traffic flow, is newly constructed, the determination "YES" is made at S200. Then, at S202, the traffic situation statistical data stored in the statistical data storage 11 is divided into statistical data before the emergence of the traffic flow effect factor and statistical data after the emergence of the traffic flow effect factor. For example, if a giant commercial facility is newly constructed, the traffic situation statistical data is divided into the statistical data before the construction of the giant commercial facility and the statistical data after the construction of the giant commercial facility. Specifically, a date (year-month-day) of the open of the facility for business contained in the facility information is read out, and the traffic situation statistical data is divided into a statistical data before the data (year-month-day) of the open for business and a statistical data (year-month-day) after the open for business.

At S204, a tendency of the statistical data before the emergence of the traffic flow effect factor is analyzed. Specifically, the statistical data before the emergence of the traffic flow effect factor is acquired from the statistical data storage 11, and a traffic situation tendency database is created. As shown in FIG. 6, on an hourly basis, the traffic situation tendency database gathers information for identifying a traffic situation of each road in an area where the traffic flow effect factor has emerged. The information for identifying the traffic situation of each road is, for example, a traffic jam degree, a transit time or the like. For example, if a giant commercial facility is newly constructed, a hourly-based traffic situation of a road in the area of the new-construction of the giant commercial facility is gathered for the statistical data before the new-construction of the giant commercial facility.

At S206, a result of the analysis of the statistical data before the emergence of the traffic flow effect factor, which analysis is conducted at S204, is recorded in the statistical data storage 11.

At S208, a tendency of the statistical data after the emergence of the traffic flow effect factor is analyzed. Specifically, the statistical data after the emergence of the traffic flow effect factor is acquired from the statistical data storage 11. As shown in FIG. 6, the controller 17 gathers information for identifying, on a hourly basis, a traffic situation of each road in the area where the traffic flow effect factor has emerged. The information for identifying the traffic situation of each road includes, for example, a traffic jam degree, a transit time or the like. For example, if a giant commercial facility is newly constructed, a hourly-based traffic situation of a road in the area of the new-construction of the giant commercial facility is gathered for the statistical data after the new-construction of the giant commercial facility.

At S210, a result of the analysis, which is conducted at S208, of the statistical data after the emergence of the traffic flow effect factor is recorded in the statistical data storage 11.

A S212, from a difference between the result of the analysis of the statistical data after the emergence of the traffic flow effect factor and the result of the analysis of the statistical data before the emergence of the traffic flow effect factor, the controller 17 identifies an effect on a traffic flow resulting from the emergence of the traffic flow effect factor, and the controller 17 records the identified effect on the traffic flow resulting from the emergence of the traffic flow effect factor in the factor-by-factor traffic flow effect database storage 14. FIG. 7 illustrates a configuration of the factor-by-factor traffic flow effect database. As shown in FIG. 7, a hourly change amount of traffic situation is stored in the factor-by-factor traffic flow effect database and classified according to items in a map change factor category and a target road category. In the present embodiment, the items in the map change factor category include scale of the traffic flow effect factor and type of the traffic flow effect factor. The items in the target road category include items associated with an area affected by the traffic flow effect factor.

When the traffic flow effect factor affecting the traffic flow has emerged from the update of the map information, the determination "NO" is made at S200. In this case, the controller 17 ends the traffic flow effect prediction database record process without conducting the above-described analysis of the traffic flow effect factor etc.

By repeatedly performing the above traffic flow effect prediction database record process, the controller 17 makes a database of effects of emergence of various traffic flow effect factors on a traffic flow on a factor-by-factor basis when the map information has been updated in past. The database is accumulated and stored in the factor-by-factor traffic flow effect database storage 14.

Figure 8:
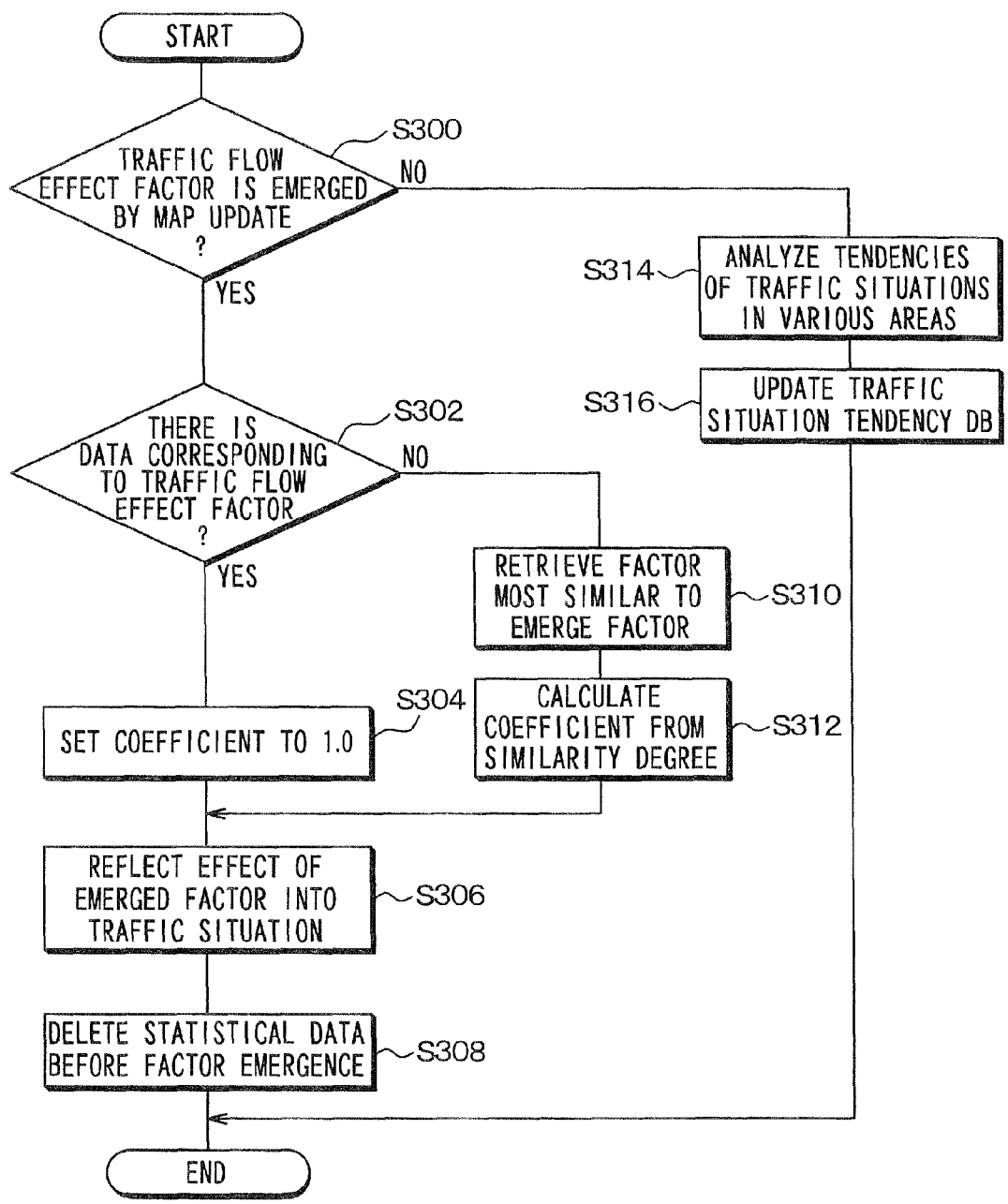
FIG. 8 is a flowchart illustrating a traffic flow effect prediction process.

Next, the traffic flow effect prediction process will be described. FIG. 8 is a flowchart illustrating the traffic flow effect prediction process. The traffic flow effect prediction process is provided to predict a traffic situation to respond to a yet-to-be-done update of the map information. In response to a predetermined trigger, the controller 17 of the traffic situation prediction apparatus 1 performs the process illustrated in FIG. 8. The predetermined trigger is, for example, user's instructions, or, the update of the map information stored in the map information storage 12 at the map information update process.

At S300, the controller 17 determines whether a traffic flow effect factor, which is a factor that affects a traffic flow, has emerged from the update of the map information. It should be noted that S300 can be substantially identical to S200.

For example, if a giant commercial facility, which is large so as to affect a traffic flow, is newly constructed, the determination "YES" is made at S300. At S302, the controller 17 determines whether a data corresponding to the emerged traffic flow effect factor is stored in the factor-by-factor traffic flow effect database storage 14.

For example, let us consider an example case where the emerged traffic flow factor is "a new-construction of a giant commercial facility on the scale of 500-vehicles capacity parking lot". In this case, if a traffic flow effect factor with the same condition "a new-construction of a giant commercial facility on the scale of 500-vehicles capacity parking lot" is stored in the factor-by-factor traffic flow effect database storage 14, the determination "YES" is made at S302 and the process proceeds to S304. At S304, a change consideration coefficient is set to "1.0". The change consideration coefficient is a coefficient for correcting the effect of a traffic flow effect factor on a traffic flow. For example, when the factor-by-factor traffic flow effect database storage 14 storing various traffic flow effect factors does not have a traffic flow effect factor identical to the traffic flow effect factor having emerged from the map update but has a traffic flow effect factor similar to the traffic flow effect factor having emerged from the map update, an effect of the similar traffic flow effect factor on the traffic flow is corrected toward the traffic flow effect factor having emerged from the map update. In this way, the controller 17 can use a parking lot capacity of the facility to identify the effect of the construction of the facility on the traffic flow by referring to the factor-by-factor traffic flow effect database.

Figure 9:
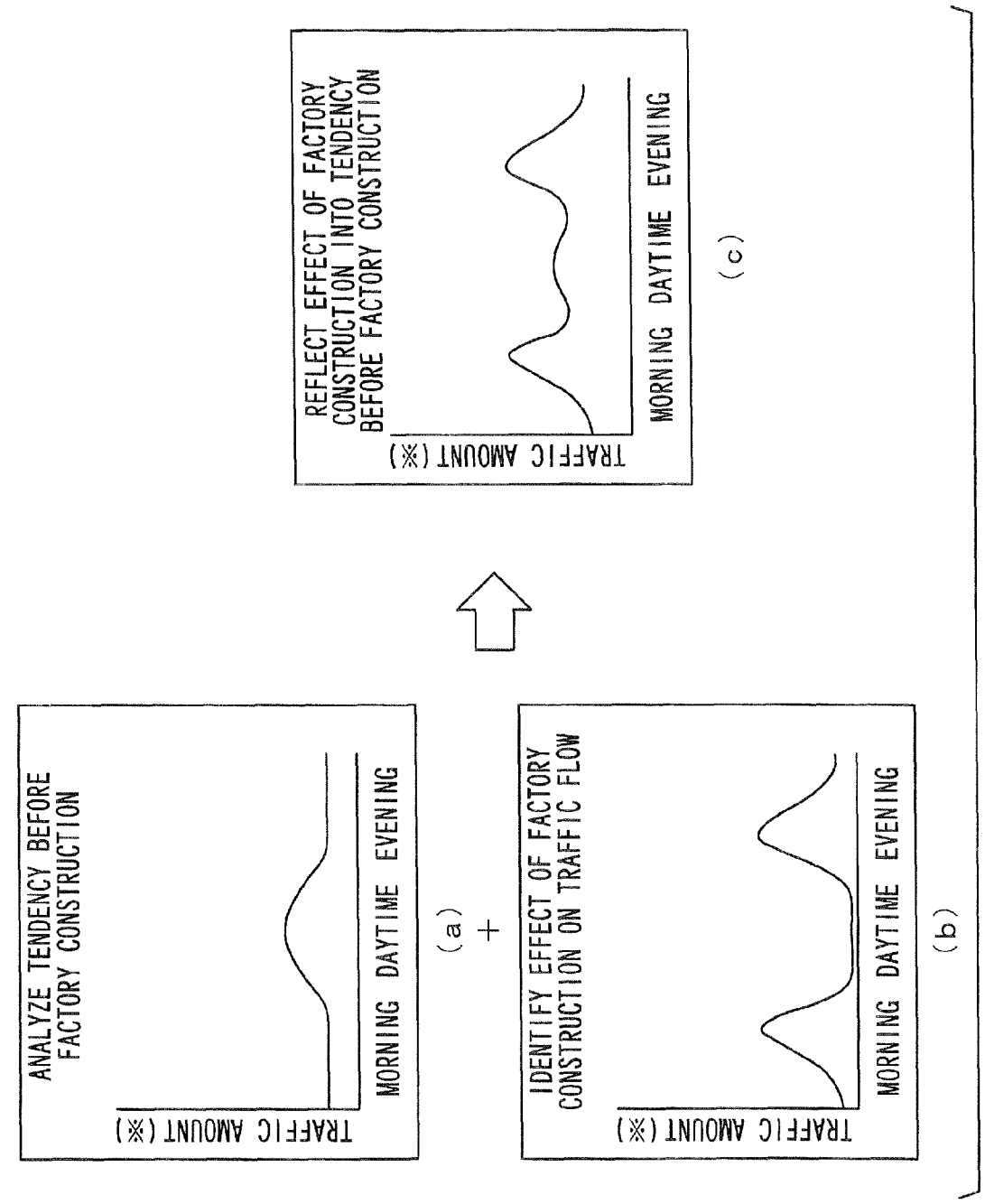
FIG. 9 is a diagram for explaining a process of incorporating an effect of emergence of a traffic flow effect factor into a traffic situation predicted based on a statistical data.

At S306, a tendency of the traffic situation is identified in such way that the effect on the traffic flow resulting from the map-update-caused emergence of the traffic flow effect factor is incorporated (reflected) into the traffic situation predicted based on the statistical data. Further, information indicating the identified tendency of the traffic situation is recorded in the traffic situation tendency database storage 13. Let us consider an example case where a factory is newly constructed. In this case, as shown in FIG. 9A, the tendency before the new-construction of the factory is analyzed using the statistical data stored in the statistical data storage 11. Then, as shown in FIG. 9B, the effect of the new-construction of the factory on the factor flow is identified using the factor-by-factor traffic flow effect database stored in the factor-by-factor traffic flow effect database storage 14. Then, as shown in FIG. 9C, the identified effect on the traffic flow is incorporated (reflected) into the traffic situation that is based on the result of the analysis of the statistical data, and the information indicating the traffic situation incorporating (reflecting) the identified effect is recorded in the traffic situation tendency database storage 13.

In the present embodiment, the controller 17 acquires a certain traffic flow effect factor that is attached with the same condition as the traffic flow effect factor having emerged from by the map update is. By incorporating (reflecting) the change consideration coefficient into the acquired certain traffic flow effect factor, the controller 17 predicts an effect on a traffic flow resulting from the map-update-caused emergence of the traffic flow effect factor. The controller 17 predicts a traffic flow by incorporating (reflecting) this predicted effect on the traffic flow into the traffic flow predicted based on the statistical data.

In the present embodiment, from the factor-by-factor traffic flow effect database storage 14, the controller 17 acquires a certain traffic flow effect factor that has the same or similar condition as the traffic flow effect factor having emerged from the map update has. By incorporating (reflecting) the change consideration coefficient into the acquired certain traffic flow effect factor, the controller 17 predicts an effect on the traffic flow resulting from the map-update-caused emergence of the traffic flow effect factor. The controller 17 predicts a traffic situation by incorporating (reflecting) this predicted effect on the traffic flow into the traffic flow that is predicted based on the statistical data.

When the change consideration coefficient is 1.0, the controller 17 predicts an effect on the traffic flow resulting form the map-update-caused emergence of the traffic flow effect factor, by using (i) the effect (e.g., traffic jam degree, transmit time, traffic amount) acquired from the factor-by-factor traffic flow effect database storage 14 as (ii) the effect on the traffic flow resulting form the map-update-caused emergence of the traffic flow effect factor.

At S308, the statistical data before the emergence of the traffic flow effect factor is deleted. Let us consider an example case where a giant commercial facility is newly constructed, and the facility information for the giant commercial facility indicates that this facility was open for business on June 1. In this case, if the statistical data before this date of the open for business is kept in the statistical data storage 11, traffic situation prediction accuracy may be lowered. For this reason, the statistical data before June 1 is deleted from the statistical data storage 11.

When a traffic flow effect factor with the same condition as the traffic flow effect factor having emerged from the map update is not stored in the factor-by-factor traffic flow effect database storage 14, the determination "NO" is made at S304, and the process proceeds to S310. At S310, the controller 17 searches for a traffic flow effect factor that is closest (most similar) to the traffic flow effect factor having emerged from the map update.

Now, let us consider an example case where the traffic flow effect factor having emerged from the map update is "new-construction of a giant commercial facility on the scale of 250-vehicle capacity parking lot". When the traffic flow effect factor with a condition "new-construction of a giant commercial facility on the scale of 500-vehicle capacity parking lot" is stored in the factor-by-factor traffic flow effect database storage 14 and is closest to the traffic flow effect factor having emerged from the map update, the controller 17 at S312 calculates the change consideration coefficient from a degree of similarity between the factors. For example, the change consideration coefficient may be calculated to be proportional to the capacity of the parking lot (the number of vehicles that can be parked in the parking lot). In this case, since the capacity of the parking lot of the traffic flow effect factor having emerged from the map update is 250 vehicles and is half of the capacity of the parking lot of the stored traffic flow effect factor closest to the traffic flow effect factor having emerged from the map update, the change consideration factor is calculated to be "0.5", and the process proceeds to S308. In this way, the controller 17 can use a parking lot capacity of the facility to identify the effect of the construction of the facility on the traffic flow by referring to the factor-by-factor traffic flow effect database.

In this case, at S308, the controller 17 calculates the effect on the traffic flow resulting from the map-update-caused emergence of the traffic flow effect factor in such way that the change consideration coefficient of 0.5 is incorporated into (multiplied by) the effect that is closest to (has a highest similarity to) the effect on the traffic flow resulting from the map-update-caused emergence of the traffic flow effect factor. For example, regarding the traffic jam degree, level of the traffic jam degree is reduced by a predetermined amount of level (e.g., one level) depending on the change additional coefficient. Regarding the transmit time, the transmit time is reduced by a predetermined amount of time depending on the change consideration coefficient. Regarding the traffic amount, the traffic amount is reduced by a predetermined number of vehicles depending on the change consideration coefficient. Through the above manners, the effect on the traffic flow resulting from the emergence of the traffic flow effect factor is calculated.

When the traffic flow effect factor affecting the traffic flow has not emerged from the update of the map information, the determination "NO" is made at S300 and the process proceeds to S314. At S314, tendencies of traffic situations in various areas are analyzed based on the statistical data stored in the statistical data storage 11.

At S316, a result of the analysis is recorded in the traffic situation tendency database storage 13. In the above, for example, if the traffic situation was already predicted at S308 by incorporating (reflecting) the effect on the traffic flow resulting from the map-update-causes emergence of the traffic flow effect factor into the traffic situation predicted based on the statistical data, and if the information indicating this predicted traffic situation is stored in the traffic situation tendency database storage 13, the traffic situation database is updated so that the tendency of the traffic situation analyzed at S314 is incorporated (reflected) into the traffic situation stored in the traffic situation tendency database storage 13. For example, the traffic situation database is updated by calculating a weighted average among the traffic amount contained in the traffic situation stored in the traffic situation tendency database storage 13 and the traffic amount contained in the traffic situation analyzed at S314.

Figure 10:
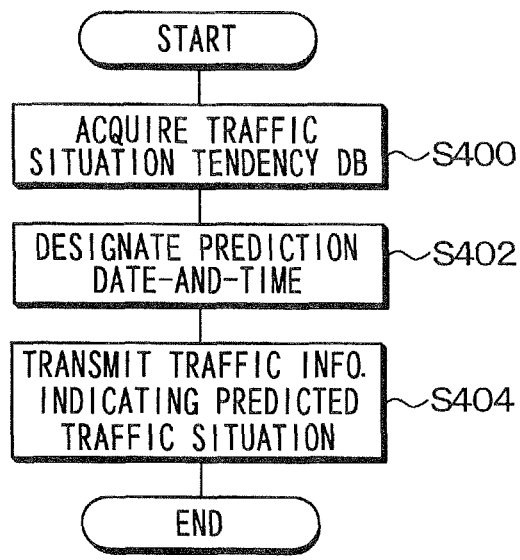
FIG. 10 is a flowchart illustrating a traffic situation prediction process.

Next, the traffic situation prediction process will be described. FIG. 10 is a flowchart illustrating the traffic situation prediction process. The controller 17 of the traffic situation prediction apparatus 1 performs the traffic situation prediction process in response to user's instructions.

At S400, the controller 17 acquires the traffic situation tendency database from the traffic situation tendency database storage 13.

At S402, the controller 17 designates a prediction date-and-time. Specifically, the controller 17 causes the display device 15 to display a prediction data-and-time input window for an input of the prediction date-and-time, and designates the prediction date-and-time in accordance with information inputted by the user according to the prediction date-and-time input window.

At S404, by referring to the traffic situation tendency database, the controller 17 predicts the traffic situation in various areas on the prediction date-and-time designated at S402. In addition, the controller 17 causes the wireless transmitter 16 to wirelessly transmit the traffic information indicating the predicted traffic situation. Specifically, by referring to the traffic situation tendency database, the controller 17 predicts the traffic situation in various areas on the prediction date-and-time designated at S402. The controller 17 predicts an affected area (identified by an effect identification means or section) associated with the effect on the traffic flow resulting from the emergence of the traffic flow effect factor, based on the data contained in the traffic flow effect database and associated with the effects of the traffic flow effect factors on the traffic flow. The controller 17 creates a guidance window to display the affected area on the map. Furthermore, a message for drawing attention to the effect on the traffic flow resulting from the emergence of the traffic flow effect factor is superimposed on the guidance window. Furthermore, the controller 17 causes the wireless transmitter 16 to wirelessly transmit the traffic information, which includes the information indicating the predicted traffic situation and the created guidance window. In this way, the traffic information including the prediction of the traffic situation having the traffic jam degree, the transit time and the traffic amount in various areas is wirelessly transmitted.

When the in-vehicle apparatus 2 mounted to the vehicle receives the traffic information wirelessly transmitted from the traffic situation prediction apparatus 1, the in-vehicle apparatus 2 displays the traffic situation in the various areas on the display device 23 based on the received traffic information.

Figure 11:
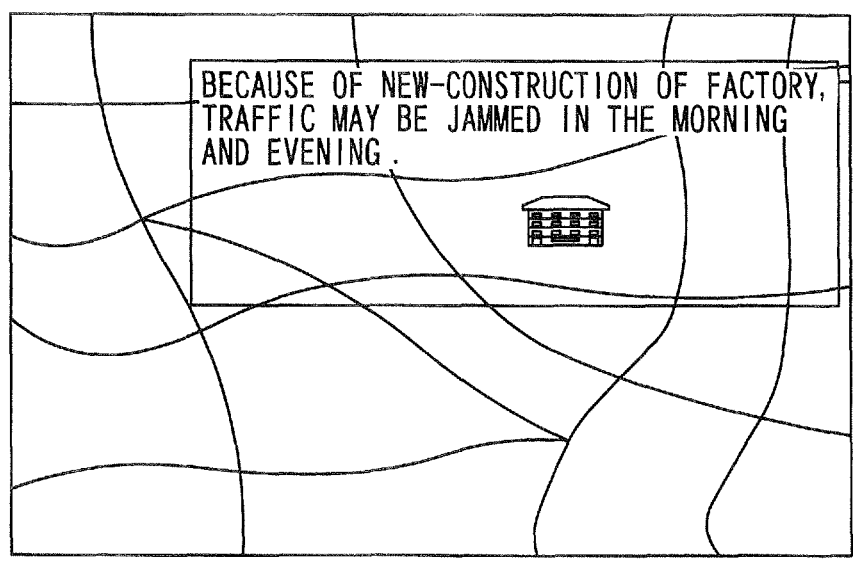
FIG. 11 is a diagram illustrating a traffic situation indication screen displayed on a display device of an in-vehicle apparatus.

FIG. 11 illustrates an example of display for indicating a traffic situation on the display device 23 of the in-vehicle apparatus 2. In the present embodiment, when a change in facility, road or the like emerged from the map update affects the traffic flow, the display displays guidance about the change in facility, road or the like affecting the traffic flow. In FIG. 11, the affected area associated with the new-construction of a factory affecting the traffic flow is superimposed on a map. Further, a message for drawing attention to the effect of the new-construction of the factory on the traffic flow is displayed.

According to the above configuration, in response to the update of the map information stored in a map information storage means or section (e.g., the map information storage 12), it is determined whether a traffic flow effect factor affecting a traffic flow has emerged based on a difference between the map information before the update and the map information after the update. When it is determined that the traffic flow effect factor has emerged, an effect on the traffic flow resulting from emergence of the traffic flow effect factor is predicted, and a traffic situation is predicted in such way that the predicted effect on the traffic flow resulting from the emergence of the traffic flow effect factor is incorporated into the traffic situation that is predicted based on the statistical data. Therefore, it is possible to improve traffic situation prediction accuracy.

Moreover, the effect on the traffic flow resulting from the emergence of the traffic flow effect factor is predicted by referring to the factory-by-factor traffic flow effect database. Therefore, immediately after the emergence of the traffic flow effect factor, it is possible to predict the effect on the traffic flow resulting form the emergence of the traffic flow effect factor by using the factory-by-factor traffic flow effect database. It should be noted that the factory-by-factor traffic flow effect database includes a database describing (predicting) effects of various traffic flow effect factors on the traffic flow on a factor-by-factor basis.

Moreover, in response to the update of the map information stored in the map information storage, the process for recording the factory-by-factor traffic flow effect database in a factory-by-factor traffic flow effect database storage is performed. Therefore, it is possible to build the factory-by-factor traffic flow effect database that reflects the actual effect of the traffic flow effect factor on the traffic flow.

Moreover, when it is determined that the traffic flow effect factor has emerged, a specific portion of the traffic situation statistical data is deleted. In the above, the specific portion represents a statistics of traffic situation in a specific area before the emergence of the traffic flow effect factor, and the specific area is an area where the traffic flow effect factor has emerged. That is, since the specific portion of the traffic situation statistical data, which represents the statistics of traffic situation before the emergence of the traffic flow effect factor and is unnecessary in prediction of a traffic situation, is deleted, it is possible to improve the traffic situation prediction accuracy.

Moreover, when it is determined the traffic flow effect factor has emerged, the effect on the traffic flow resulting from the traffic flow effect factor is predicted, and the traffic situation is predicted by incorporating the effect of the emerged traffic flow effect factor on the traffic flow into the traffic situation predicted based on the statistical data. Then, the traffic situation statistical data is successively-updated. Then, based on the successively-updated traffic situation statistical data after the emergence of the traffic flow effect factor, the traffic situation in the specific area is predicted. Therefore, it is possible to improve traffic situation prediction accuracy.

Moreover, the traffic flow effect data contains a data of the affected areas, which indicates an area under the effect of corresponding traffic flow effect factor. Based on the data of the affected areas contained in the traffic flow effect data, an effect identification means or section (controller 17) predicts the affected area having the traffic flow affected by the emergence of the traffic flow. In addition, the guidance window for displaying the affected area on the map is created. Therefore, a user can visually recognize, with ease, the affected area having the traffic flow affected by the emergence of the traffic flow effect factor.

Moreover, since the message for drawing attention to the effect of the emergence of the traffic flow effect factor on the traffic flow is superimposed on the guidance window. Therefore, a user can visually recognize the effect of the emergence of the traffic flow effect factor on the traffic flow with ease.

Embodiments of the present invention are not limited to the above-described embodiment and can have various forms, examples of which will be described below.

In the above embodiment, a server installed in the information center is configured to act as the traffic situation prediction apparatus 1. Alternatively, the in-vehicle apparatus 2 may be provided with functions of the traffic situation prediction apparatus 1, and the in-vehicle apparatus 2 may be configured to act as the traffic situation prediction apparatus 1.

In the above embodiment, the traffic situation prediction apparatus 1 performs a process of recording and accumulating the factory-by-factor traffic flow effect database in the factor-by-factor traffic flow effect database storage, so that the factor-by-factor traffic flow effect database includes a database predicting the effects of each of the various traffic flow effect factors on the traffic flow on a factor-by-factor basis at a time of the update of the map information. Alternatively, for example, the factor-by-factor traffic flow effect database storage may store a factor-by-factor traffic flow effect database created by a user, in consideration of an effect on the traffic flow that had emerged in past.

In the above embodiment: the tendency of the traffic flow before the new-construction of a factory is analyzed using the statistical data; the effect on the traffic flow resulting from the new-construction of the factory is identified using the factor-by-factor traffic flow effect database; and this identified effect on the traffic flow is incorporated into the traffic situation that is based on the result of the analysis of the statistical data. Alternatively, the tendency of the traffic flow before the new-construction of a factory may not be analyzed. In stead, for example, the tendency of the traffic flow in an area located around the newly-constructed factory and not affected by the new construction of the factory may be analyzed. Then the effect of the new-construction of the factory on the traffic flow may be identified using the factor-by-factor traffic flow effect database, and this identified effect on the traffic flow may be incorporated into the traffic situation that is based on the result of the analysis of the statistical data.

In the above embodiment, the display for indicating the traffic situation displays the map window and the message. On the map window, the affected area having the traffic flow affected by the new-construction of the factory is superimposed. The message is provide to draw attention to the effect of the new-construction of the factory on the traffic flow. Alternatively, for example, if a new large scale facility is being constructed, the display for indicating the traffic situation may display a message from a person in charge of the facility affecting the traffic flow, e.g., "because of the construction of a new large scale facility, the traffic of roads around this facility may be jammed between 8.00 am and 9.00 am and between 5.00 pm and 6.00 pm. Inconvenience regretted. Thank you for your cooperation.". By displaying this kind of message, the person in charge of the facility can show an extent of the effect to public, and can fulfill his social responsibility.

In the above embodiment, the display for indicating the traffic situation displays the map window and the message. On the map window, the affected area having the traffic flow affected by the new-construction of the factory is superimposed. The message is provide to draw attention to the effect of the new-construction of the factory on the traffic flow. Alternatively, for example, if a new road has been constructed, the display for indicating the traffic situation may display such a message about a purpose of the construction of the new road from a person in charge of the new road, e.g., "A bypass highway has been constructed in order to relax the chronic traffic jam between 6.00 am and 9.00 am around a "A" point on the national route 1. We hope this is useful for you.". By displaying this kind of message, the person in charge of the road can show the purpose of road change etc. to public.

In the example case of the above embodiment, the change consideration coefficient is calculated to be 0.5 at S312 because the parking lot capacity of the traffic flow effect factor emerged by the map update is 250 vehicles and is half of the parking lot capacity of a traffic flow effect factor that is most similar to the traffic flow effect factor emerged by the map update. However, this manner of calculating the change consideration coefficient is merely an example, and does not limit embodiments.

In the above embodiment, the traffic situation prediction apparatus is configured to: identify the traffic flow effect factor affecting the traffic flow based on the difference between the map information before and after the update; and predict the traffic situation by incorporating the effect of the emergence of the traffic flow effect flow on the traffic flow into the traffic situation that is predicted based on the traffic situation statistical database, which is created by collecting the vehicle run information. Alternatively, for example, the traffic situation prediction apparatus may further have a function to retrieve a guidance route from a departure point and destination point by taking into account a result of the prediction of the traffic situation. For example, a route with a smallest travel time may be retrieved. Alternatively, a result of the prediction of the traffic situation may be successively used to calculate and update a destination arrival time.

In the above embodiments, the map information storage 12 can correspond to a map information storage means or section. The controller 17, which performs S300, can correspond to a determination means or section. The controller 17, which performs S304, S306, S310, S312 and S400 to S404, can correspond to an effect identification means or section and a traffic information prediction means or section. The factor-by-factor traffic flow effect database storage 14 can correspond to a factor-by-factor traffic flow effect prediction database storage means or section (also abbreviated to as "effect prediction database storage"). The controller 17, which performs the traffic flow effect prediction database record process illustrated in FIG. 5, can correspond to a factor-by-factor traffic flow effect prediction database record means or section (also abbreviated to as "effect database record means or section"). The controller 17, which performs S404, can correspond to a guidance window creation means or section. The controller 17, which performs S308, can correspond to a statistical data deletion means or section.

According to one example of embodiments, a traffic situation prediction apparatus for predicting a traffic situation based on traffic situation statistical data created by collecting information on runs of vehicles on roads may be configured in the following way. The traffic situation prediction apparatus includes a map information storage, a determination section, an effect identification section, and a traffic information prediction section. The map information storage stores map information. The determination section is configured to determine, in response to an update of the map information stored in the map information storage, whether a specific traffic flow effect factor affecting a traffic flow has emerged based on a difference between the map information before and after the update. The effect identification section is configured to identify an effect on the traffic flow resulting from emergence of the specific traffic flow effect factor when the determination section determines that the specific traffic flow effect factor has emerged. The traffic information prediction section is configured to predict the traffic situation by incorporating (i) the effect identified by the effect identification section into (ii) the traffic situation predicted based on the traffic situation statistical data.

According to the above configuration, in response to the update of the map information stored in the map information storage, it is determined whether the specific traffic flow effect factor affecting the traffic flow, has emerged based on the difference between the map information before the update and the map information after the update. When it is determined that the specific traffic flow effect factor has emerged, the effect on the traffic flow resulting from the emergence of the specific traffic flow effect factor is predicted, and the traffic situation is predicted by incorporating (i) the effect on the traffic flow resulting from the emergence of the specific traffic flow effect factor into (ii) the traffic situation predicted based on the statistical data. Therefore, it is possible to improve traffic situation prediction accuracy.

The above traffic situation prediction apparatus may be configured to further include an effect prediction database storage that stores a factor-by-factor traffic flow effect database that predicts the effect of each of various traffic flow effect factors on the traffic flow on a factor-by-factor basis. By referring to the factor-by-factor traffic flow effect database, the effect identification section may identify the effect on the traffic flow resulting from the emergence of the specific traffic flow effect factor.

According to the above configuration, since the effect on the traffic flow resulting from the emergence of the specific traffic flow effect factor is predicted by referring to the factory-by-factor traffic flow effect database, it is possible to predict, immediately after the emergence of the specific traffic flow effect factor, the effect on the traffic flow resulting form the emergence of the specific traffic flow effect factor by using the factory-by-factor traffic flow effect database.

The above traffic situation prediction apparatus may be configured to further include an effect database record section that is configured to perform, in response to the update of the map information stored in the map information storage, an operation of recording the factor-by-factor traffic flow effect database in the effect prediction database storage.

According to the above configuration, in response to the update of the map information stored in the map information storage, the process of recording the factory-by-factor traffic flow effect database in the effect prediction database storage is performed. Therefore, it is possible to build the factory-by-factor traffic flow effect database that reflects an actual effect of a traffic flow effect factor on a traffic flow.

The above traffic situation prediction apparatus may be configured to further include a statistical data deletion section that is configured to delete a specific portion of the traffic situation statistical data when the determination section determines that the specific traffic flow effect factor has emerged. The specific portion represents the traffic situation in a specific area before the emergence of the specific traffic flow effect factor. The specific area is an area where the specific traffic flow effect factor has emerged.

According to the above configuration, when it is determined that the specific traffic flow effect factor has emerged, the specific portion of the traffic situation statistical data is deleted. That is, since the specific portion of the traffic situation statistical data, which is unnecessary in prediction of a traffic situation, is deleted, it is possible to improve the traffic situation prediction accuracy.

According to one example of embodiments, a traffic situation prediction apparatus for predicting a traffic situation based on traffic situation statistical data created by collecting information on runs of vehicles on roads includes a map information storage, a determination section, an effect prediction database storage, an effect identification section, a traffic information prediction section and a statistical data deletion section. The map information storage stores map information. The determination section is configured to determine, in response to an update of the map information stored in the map information storage, whether a specific traffic flow effect factor affecting a traffic flow has emerged based on a difference between the map information before and after the update of the map information. The effect prediction database storage stores a factor-by-factor traffic flow effect database that predicts an effect of each of various traffic flow effect factors on the traffic flow on a factor-by-factor basis. The effect identification section is configured to identify the effect on the traffic flow resulting from emergence of the specific traffic flow effect factor by referring to the factor-by-factor traffic flow effect database when the determination section determines that the specific traffic flow effect factor has emerged. The traffic information prediction section is configured to predict the traffic situation in a specific area by incorporating (i) the effect identified by the effect identification section into (ii) the traffic situation predicted based on the traffic situation statistical data when the determination section determines that the specific traffic flow effect factor has emerged, wherein the specific area is an area where the specific traffic flow effect factor has emerged. The statistical data deletion section is configured to delete a specific portion of the traffic situation statistical data when the determination section determines that the specific traffic flow effect factor has emerged, wherein the specific portion represents the traffic situation in the specific area before the emergence of the specific traffic flow effect factor. The traffic situation statistical data is successively updated after the determination section determines that the specific traffic flow effect factor has emerge and after the traffic information prediction section has predicted the traffic situation in the specific area by incorporating the identified effect into the traffic situation predicted based on the traffic situation statistical data. The traffic information prediction section is further configured to predict the traffic situation in the specific area based on the traffic situation statistical data having successively-updated after the emergence of the specific traffic flow effect factor.

According to the above configuration, in response to the update of the map information, it is determined whether the specific traffic flow effect factor has emerged based on the difference between the map information before and after the update of the map information. When it is determined that the specific traffic flow effect factor has emerged, the effect on the traffic flow resulting from the emergence of the specific traffic flow effect factor is identified by referring to the factor-by-factor traffic flow effect database. The traffic situation in the specific area where the specific traffic effect factor has emerged is predicted in such way that the effect identified by the effect identification section is incorporated into the traffic situation predicted based on the traffic situation statistical data. Further, when it is determined that the specific traffic flow effect factor has emerged, the specific portion of the traffic situation statistical data is deleted, and then, the traffic situation in the specific area is predicted based on the successively-updated traffic situation statistical data after the emergence of the traffic flow effect factor. Therefore, it is possible to improve the traffic situation prediction accuracy.

The above traffic situation prediction apparatus may be configured such that: the factor-by-facto traffic flow effect database contains data of a type of each of the various traffic flow effect factors, a scale of each of the various traffic flow effect factors, a hourly change in the traffic flow due to each of the various traffic flow effect factors, and an affected area having the traffic flow affected by each of the various traffic flow effect factors.

In the above configuration, the type of each traffic flow effect factor may be described as, for example, new-construction of a facility such as a giant commercial facility, a factory and the like, close of a facility, demolition of a facility, expansion of a facility, scale down of a facility, new-construction of a road, close of a road, a change in number of lanes of a road, or the like. The scale of each traffic flow effect factor may be described as, for example, a vehicle parking capacity, a person accommodation capacity, a number of employees, a site area or the like.

The above traffic situation prediction apparatus may be configured such that: the effect identification section is further configured to identify a specific area, which is an area affected by the emergence of the specific traffic flow effect factor, from the data of the affected area contained in the factor-by-factor-basis traffic flow effect database. In addition, the traffic information prediction apparatus may be configured to further include: a guidance window creation section that is configured to create a guidance window that displays the specific area identified by the effect identification section on a map.

According to the above configuration, the traffic flow effect data contains the data of the affected area, which indicates an area affected by each traffic flow effect factor. Based on the data of the affected area contained in the traffic flow effect data, the affected area where the traffic flow is affected by the emergence of the specific traffic flow effect factor is predicted by an effect identification means or section. The guidance window displaying the affected area on the map is created. Therefore, a user can visually recognize, with ease, the affected area where the traffic flow is affected by the emergence of the specific traffic flow effect factor.

The above traffic situation prediction apparatus may be configured such that: the guidance window creation section is further configured to superimpose, on the guidance window, a message for drawing attention to the effect on the traffic flow resulting from the emergence of the specific traffic flow effect factor.

According to the above configuration, the message for drawing attention to the effect on the traffic flow resulting from the emergence of the specific traffic flow effect factor is superimposed on the guidance window. Therefore, a user can visually recognize, with ease, the effect on the traffic flow resulting from the emergence of the specific traffic flow effect factor.

The above traffic situation prediction apparatus may be configured in the following way. The specific traffic flow effect factor includes new-construction, close, demolition, scale up and scale down of a facility including a giant commercial facility and a factory. Further, the specific traffic flow effect factor may include new-construction of a road, close of a road, and a change in number of lanes of a road. For example, when the specific traffic flow effect factor is identified as the new-construction of the facility, the effect identification section (17) may use a parking lot capacity of the facility to identify the effect of the new-construction of the facility on the traffic flow by referring to the factor-by-factor traffic flow effect database.

Alternatively, the above traffic situation prediction apparatus may be configured in the following way. The effect identification section is configured to identify the effect on the traffic flow resulting from the emergence of the specific traffic flow effect factor, by: retrieving one of the various traffic flow effect factors that is most similar to the emerged specific traffic flow effect factor among the various traffic flow effect factors; calculating a change consideration coefficient indicating a degree of similarity between the specific traffic flow effect factor and the retrieved one of the various traffic flow effect factors; and incorporating the change consideration coefficient into the effect on the traffic flow resulting from the emergence of the specific traffic flow effect factor.

What is claimed is:

1. A traffic situation prediction apparatus for predicting a traffic situation based on traffic situation statistical data created by collecting information on runs of vehicles on roads, the traffic situation prediction apparatus comprising:
a map information storage storing map information;

a determination section configured to determine, in response to an update of the map information stored in the map information storage, whether a specific traffic flow effect factor affecting a traffic flow has emerged based on a difference between the map information before and after the update;

an effect identification section configured to identify an effect on the traffic flow resulting from emergence of the specific traffic flow effect factor when the determination section determines that the specific traffic flow effect factor has emerged;

a traffic information prediction section configured to predict the traffic situation by incorporating (i) the effect identified by the effect identification section into (ii) the traffic situation predicted based on the traffic situation statistical data; and an effect prediction database storage storing a factor-by-factor traffic flow effect database that predicts the effect of each of various traffic flow effect factors on the traffic flow on a factor-by-factor basis, wherein:

by referring to the factor-by-factor traffic flow effect database, the effect identification section identifies the effect on the traffic flow resulting from the emergence of the specific traffic flow effect factor.

2. The traffic situation prediction apparatus according to claim 1, further comprising:

an effect database record section configured to perform, in response to the update of the map information stored in the map information storage, an operation of recording the factor-by-factor traffic flow effect database in the effect prediction database storage.

3. The traffic situation prediction apparatus according to claim 1, further comprising:

a statistical data deletion section configured to delete a specific portion of the traffic situation statistical data when the determination section determines that the specific traffic flow effect factor has emerged, the specific portion representing the traffic situation in a specific area before the emergence of the specific traffic flow effect factor, the specific area being a area where the specific traffic flow effect factor has emerged.

4. A traffic situation prediction apparatus for predicting a traffic situation based on traffic situation statistical data created by collecting information on runs of vehicles on roads, the traffic situation prediction apparatus comprising:

a map information storage storing map information;

a determination section configured to determine, in response to an update of the map information stored in the map information storage, whether a specific traffic flow effect factor affecting a traffic flow has emerged based on a difference between the map information before and after the update of the map information;

an effect prediction database storage storing a factor-by-factor traffic flow effect database that predicts an effect of each of various traffic flow effect factors on the traffic flow on a factor-by-factor basis;

an effect identification section configured to identify the effect on the traffic flow resulting from emergence of the specific traffic flow effect factor by referring to the factor-by-factor traffic flow effect database when the determination section determines that the specific traffic flow effect factor has emerged;

a traffic information prediction section configured to predict the traffic situation in a specific area by incorporating (i) the effect identified by the effect identification section into (ii) the traffic situation predicted based on the traffic situation statistical data when the determination section determines that the specific traffic flow effect factor has emerged, wherein the specific area is an area where the specific traffic flow effect factor has emerged; and a statistical data deletion section configured to delete a specific portion of the traffic situation statistical data when the determination section determines that the specific traffic flow effect factor has emerged, wherein the specific portion represents the traffic situation in the specific area before the emergence of the specific traffic flow effect factor, wherein:

the traffic situation statistical data is successively updated after the determination section determines that the specific traffic flow effect factor has emerge and after the traffic information prediction section has predicted the traffic situation in the specific area by incorporating the identified effect into the traffic situation predicted based on the traffic situation statistical data; and the traffic information prediction section is further configured to predict the traffic situation in the specific area based on the traffic situation statistical data having successively-updated after the emergence of the specific traffic flow effect factor.

5. The traffic situation prediction apparatus according to claim 1, wherein:

the factor-by-factor traffic flow effect database contains data of a type of each of the various traffic flow effect factors, a scale of each of the various traffic flow effect factors, a hourly change in the traffic flow due to each of the various traffic flow effect factors, and an affected area having the traffic flow affected by each of the various traffic flow effect factors.

6. The traffic situation prediction apparatus according to claim 5, wherein:

the effect identification section is further configured to identify a specific area, which is an area affected by the emergence of the specific traffic flow effect factor, from the data of the affected area contained in the factor-by-factor-basis traffic flow effect database, the traffic information prediction apparatus further comprising:

a guidance window creation section configured to create a guidance window that displays, on a map, the specific area identified by the effect identification section.

7. The traffic situation prediction apparatus according to claim 6, wherein:

the guidance window creation section is further configured to superimpose, on the guidance window, a message for drawing attention to the effect on the traffic flow resulting from the emergence of the specific traffic flow effect factor.

8. The traffic situation prediction apparatus according to claim 1, wherein:

the specific traffic flow effect factor includes new-construction, close, demolition, scale up and scale down of a facility including a giant commercial facility and a factory.

9. The traffic situation prediction apparatus according to claim 1, wherein:

the specific traffic flow effect factor includes new-construction of a road, close of a road, and a change in number of lanes of a road.

10. The traffic situation prediction apparatus according to claim 1, wherein:

the specific traffic flow effect factor includes new-construction of a facility; and when the specific traffic flow effect factor is identified as the new-construction of the facility, the effect identification section uses a parking lot capacity of the facility to identify the effect of the new-construction of the facility on the traffic flow by referring to the factor-by-factor traffic flow effect database.

11. The traffic situation prediction apparatus according to claim 1, wherein the effect identification section identifies the effect on the traffic flow resulting from the emergence of the specific traffic flow effect factor, by:

retrieving one of the various traffic flow effect factors that is most similar to the emerged specific traffic flow effect factor among the various traffic flow effect factors;

calculating a change consideration coefficient indicating a degree of similarity between the specific traffic flow effect factor and the retrieved one of the various traffic flow effect factors; and incorporating the change consideration coefficient into the effect on the traffic flow resulting from the emergence of the specific traffic flow effect factor.

* * * * *